(12) United States Patent
Chen et al.

(10) Patent No.: US 12,609,177 B2
(45) Date of Patent: Apr. 21, 2026

(54) MEMORY DEVICE AND INTERNAL VOLTAGE MEASURING METHOD THEREOF

(71) Applicant: NANYA TECHNOLOGY CORPORATION, New Taipei City (TW)

(72) Inventors: Chih-Jen Chen, New Taipei City (TW); Ting-Shuo Hsu, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 128 days.

(21) Appl. No.: 18/815,802

(22) Filed: Aug. 26, 2024

(65) Prior Publication Data

US 2026/0057951 A1 Feb. 26, 2026

(51) Int. Cl.
| | |
|---|---|
| *G11C 5/06* | (2006.01) |
| *G11C 29/12* | (2006.01) |
| *G11C 5/02* | (2006.01) |
| *G11C 5/04* | (2006.01) |
| *G11C 8/12* | (2006.01) |

(52) U.S. Cl.
CPC .... *G11C 29/12005* (2013.01); *G11C 29/1201* (2013.01); *G11C 5/02* (2013.01); *G11C 5/025* (2013.01); *G11C 5/04* (2013.01); *G11C 8/12* (2013.01)

(58) Field of Classification Search
CPC . G11C 29/12005; G11C 29/1201; G11C 5/04; G11C 5/02; G11C 8/12; G11C 5/025
USPC .......................................................... 365/201
See application file for complete search history.

(56) References Cited

U.S. PATENT DOCUMENTS

| | | | | |
|---|---|---|---|---|
| 2008/0204091 A1* | 8/2008 | Choo | ........................ | G11C 5/02 |
| | | | | 327/149 |
| 2010/0020583 A1* | 1/2010 | Kang | ........................ | G11C 5/02 |
| | | | | 365/51 |
| 2014/0002120 A1* | 1/2014 | Oh | ..................... | G01R 31/2884 |
| | | | | 257/E23.002 |
| 2016/0161968 A1 | 6/2016 | Kim et al. | | |

FOREIGN PATENT DOCUMENTS

| | | |
|---|---|---|
| TW | 202349203 A | 12/2023 |

OTHER PUBLICATIONS

"Office Action of Taiwan counterpart Application", issued on Nov. 20, 2025, p. 1-p. 8.

* cited by examiner

*Primary Examiner* — Ly D Pham
(74) *Attorney, Agent, or Firm* — JCIPRNET

(57) ABSTRACT

A memory device and an internal voltage measuring method thereof are provided. Output pads of a master memory chip and a slave memory chip are coupled. When one of a switching circuit of the master memory chip and a switching circuit of the slave memory chip is turned on, the other of the switching circuit of the master memory chip and the switching circuit of the slave memory chip is turned off.

10 Claims, 4 Drawing Sheets

100

MEMORY DEVICE AND INTERNAL VOLTAGE MEASURING METHOD THEREOF

BACKGROUND

Technical Field

The disclosure relates to an electronic device, and more particularly, to a memory device and an internal voltage measuring method thereof.

Description of Related Art

An area of a current dynamic random access memory integrated circuit (DRAM IC) is limited, and multiple dynamic random access memory chips are required to be coupled and stacked through a through silicon via (TSV), so as to achieve a purpose of increasing capacity. However, the stacking of the chips will make it difficult to measure an internal voltage of some chips, making it difficult to perform chip testing.

SUMMARY

The disclosure provides a memory device and an internal voltage measuring method thereof, which may measure an internal voltage of each of stacked chips and improve convenience of chip testing.

A memory device in the disclosure includes a master memory chip and at least one slave memory chip. The master memory chip includes a first control circuit, a first output pad, and a first switching circuit. The first switching circuit is coupled between a first internal voltage output end of the master memory chip and the first output pad. The first control circuit controls the first switching circuit, and the first internal voltage output end is configured to output a first internal voltage. The master memory chip and the slave memory chip are stacked on each other. Each of the slave memory chips includes a second control circuit, a second output pad, and a second switching circuit. The second output pad is coupled to the first output pad. The second switching circuit is coupled between a second internal voltage output end of the memory chip and the second output pad. The second internal voltage output end is configured to output a second internal voltage. The second control circuit controls the second switching circuit. When one of the first switching circuit and the second switching circuit is turned on, the other of the first switching circuit and the second switching circuit is turned off.

In an embodiment of the disclosure, the memory device includes multiple slave memory chips. When one of multiple second switching circuits of the slave memory chips and the first switching circuit of the master memory chip is turned on, the remaining switching circuits of the second switching circuits and the first switching circuit of the master memory chip are turned off.

In an embodiment of the disclosure, the master memory chip further includes a first internal voltage output circuit, and the slave memory chip further includes a second internal voltage output circuit. The first internal voltage output circuit is coupled to the first switching circuit and provides the first internal voltage. The second internal voltage output circuit is coupled to the second switching circuit and provides the second internal voltage.

In an embodiment of the disclosure, the first internal voltage output circuit and the second internal voltage output circuit respectively include multiple selection transistors and an output transistor. A turned-on state of each of the selection transistors is controlled by a corresponding selection signal. Each of the selection transistors is coupled between a corresponding internal voltage and the output transistor. The output transistor is further coupled to the first internal voltage output end or the second internal voltage output end, and a turned-on state of the output transistor is controlled by an output control signal.

In an embodiment of the disclosure, the slave memory chip outputs the second internal voltage through the first output pad.

In an embodiment of the disclosure, the first output pad and the second output pad are coupled to each other through a through silicon via.

In an embodiment of the disclosure, the first control circuit and the second control circuit respectively include a first AND gate, a first NOT gate, a second NOT gate, a second AND gate, and an OR gate. A first input end and a second input end of the first AND gate receive a first control signal and a second control signal respectively. An input end of the first NOT gate is coupled to the first input end of the first AND gate. An input end of the second NOT gate is coupled to the second input end of the first AND gate. A first input end and a second input end of the second AND gate are respectively coupled to output ends of the first NOT gate and the second NOT gate. A first input end and a second input end of the OR gate are respectively coupled to the output ends of the first NOT gate and the second NOT gate, and an output end of the OR gate is coupled to the first switching circuit or the second switching circuit.

The disclosure further provides an internal voltage measuring method of a memory device. The memory device includes a master memory chip and at least one slave memory chip. The master memory chip includes a first output pad. Each of the slave memory chips includes a second output pad. The internal voltage measuring method of the memory device includes the following steps. Providing a first internal voltage of the master memory chip from the first output pad by controlling a first switching circuit. Providing a second internal voltage of the slave memory chip from the second output pad by controlling a second switching circuit. The master memory chip and the slave memory chip are stacked on each other and the first output pad is coupled to the second output pad. When the second internal voltage of the slave memory chip is measured, the first switching circuit is turned off, and the second switching circuit is turned on. When the first internal voltage of the master memory chip is measured, the second switching circuit is turned off, and the first switching circuit is turned on.

In an embodiment of the disclosure, the slave memory chip outputs the second internal voltage through the first output pad.

In an embodiment of the disclosure, the first output pad and the second output pad are coupled to each other through a through silicon via.

Based on the above, in the embodiments of the disclosure, the output pads of the master memory chip and the slave memory chip are coupled, and the turned-on state of the switching circuit coupled to the output pad and the internal voltage output end in the master memory chip and the slave memory chip is controlled. When one of the switching circuit of the master memory chip and the switching circuit of the slave memory chip is turned on, the other of the switching circuit of the master memory chip and the switching circuit of the slave memory chip is turned off, so as to output internal voltage of the master memory chip or the slave memory chip from the output pad of the master memory chip. In this way, the internal voltage of each of the stacked chips may be measured, improving the convenience of the chip testing.

In order for the aforementioned features and advantages of the disclosure to be more comprehensible, embodiments accompanied with drawings are described in detail below.

DETAILED DESCRIPTION OF DISCLOSED EMBODIMENTS

Figure 1:
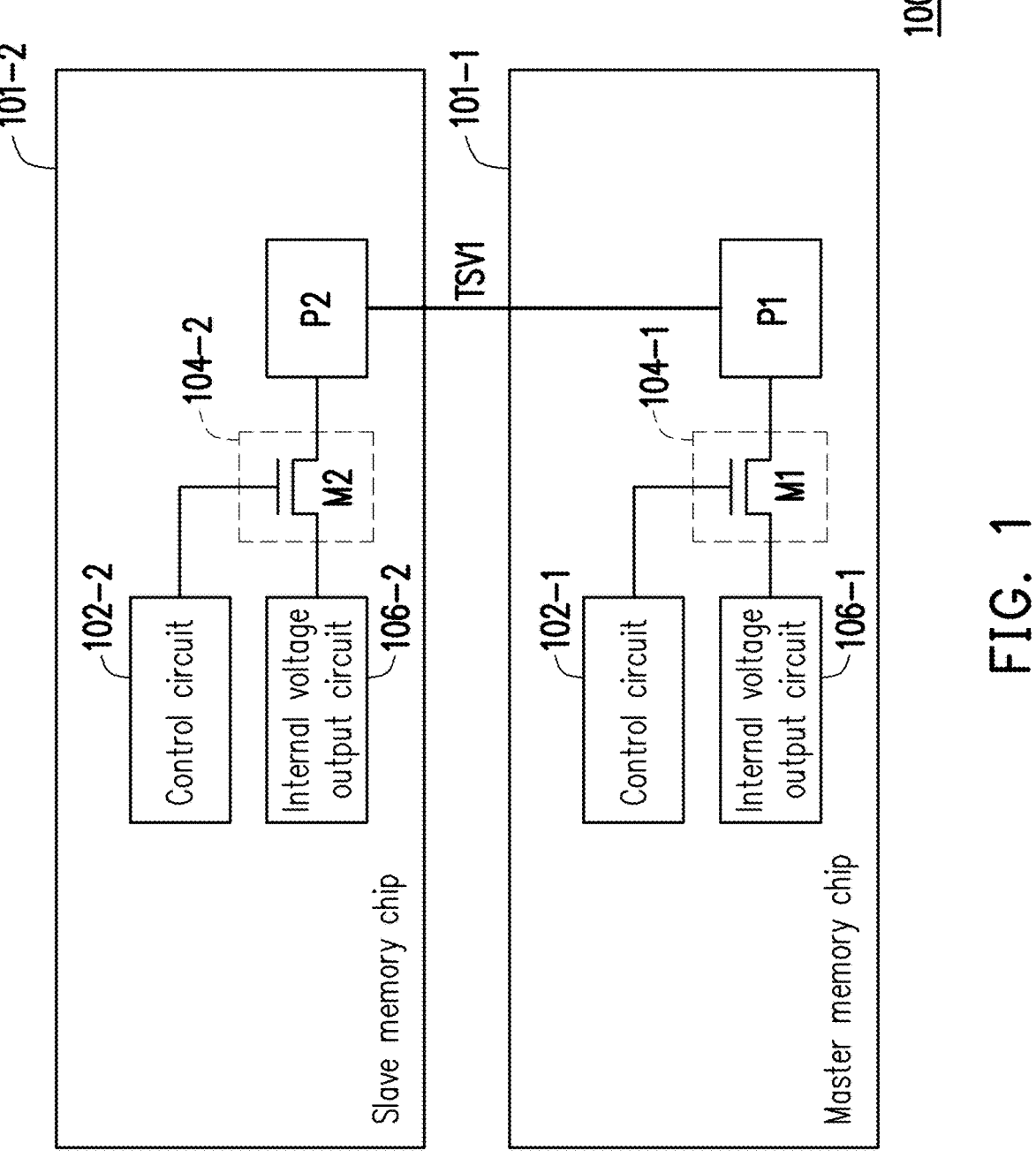
FIG. 1 is a schematic view of a memory device according to an embodiment of the disclosure.

FIG. 1 is a schematic view of a memory device according to an embodiment of the disclosure. Referring to FIG. 1, a memory device 100 includes a master memory chip 101-1 and a slave memory chip 101-2. The master memory chip 101-1 and the slave memory chip 101-2 are stacked on each other. The master memory chip 101-1 includes a control circuit 102-1, a switching circuit 104-1, an internal voltage output circuit 106-1, and an output pad P1. The switching circuit 104-1 is coupled between an output end (an internal voltage output end) of the internal voltage output circuit 106-1 and the output pad P1, and a control end of the switching circuit 104-1 is coupled to the control circuit 102-1. Similarly, the slave memory chip 101-2 includes a control circuit 102-2, a switching circuit 104-2, an internal voltage output circuit 106-2, and an output pad P2. The switching circuit 104-2 is coupled between an output end of the internal voltage output circuit 106-2 and the output pad P2, and a control end of the switching circuit 104-2 is coupled to the control circuit 102-2. In addition, the output pad P1 is coupled to the output pad P2. Furthermore, the output pad P1 may be coupled to the output pad P2 through a through silicon via TSV1, for example. The master memory chip 101-1 and the slave memory chip 101-2 may be, for example, dynamic random access memory chips, but the disclosure is not limited thereto. In this embodiment, the switching circuits 104-1 and 104-2 are implemented by transistors M1 and M2 respectively, but other embodiments are not limited thereto.

Figure 2:
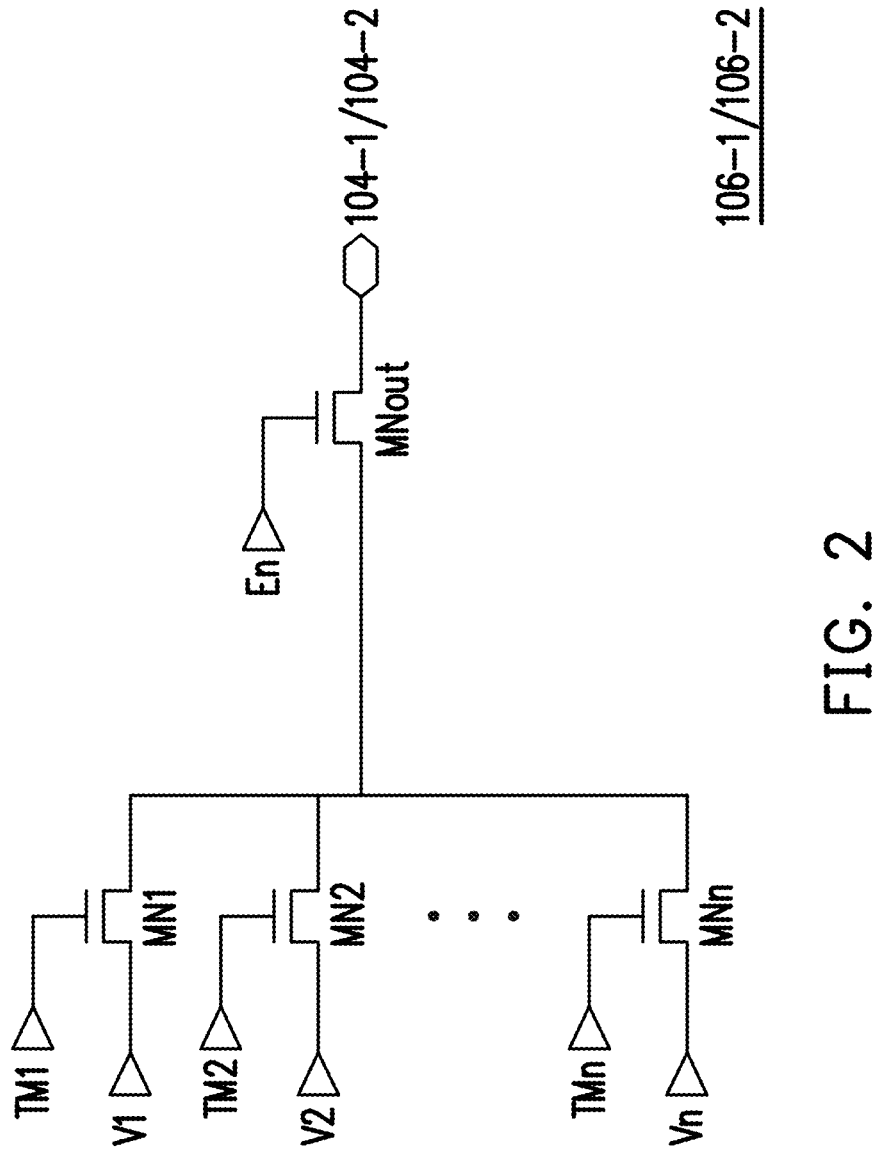
FIG. 2 is a schematic view of an internal voltage output circuit according to an embodiment of the disclosure.

The internal voltage output circuits 106-1 and 106-2 are respectively configured to output internal voltages of the master memory chip 101-1 and the slave memory chip 101-2. An implementation of the internal voltage output circuits 106-1 and 106-2 may be, for example, shown in FIG. 2, including multiple selection transistors MN1 to MNn and an output transistor MNout, where n is a positive integer. One end of the selection transistors MN1 to MNn is coupled to corresponding internal voltages V1 to Vn, and the other end of the selection transistors MN1 to MNn is coupled to one end of the output transistor MNout. The selection transistors MN1 to MNn are controlled by corresponding selection signals TM1 to TMn. The other end of the output transistor MNout is coupled to the switching circuit 104-1 or 104-2. That is to say, if the output transistor MNout belongs to the internal voltage output circuit 106-1, the other end of the output transistor MNout is coupled to the switching circuit 104-1, and if the output transistor MNout belongs to the internal voltage output circuit 106-2, the other end of the output transistor MNout is coupled to the switching circuit 104-2. The output transistor MNout is controlled by an output control signal En. The selection signals TM1 to TMn are configured to select the internal voltages V1 to Vn to be output, and the output control signal En is configured to decide whether to enable the internal voltage output circuits 106-1 and 106-2 to output the selected internal voltage.

Figure 3:
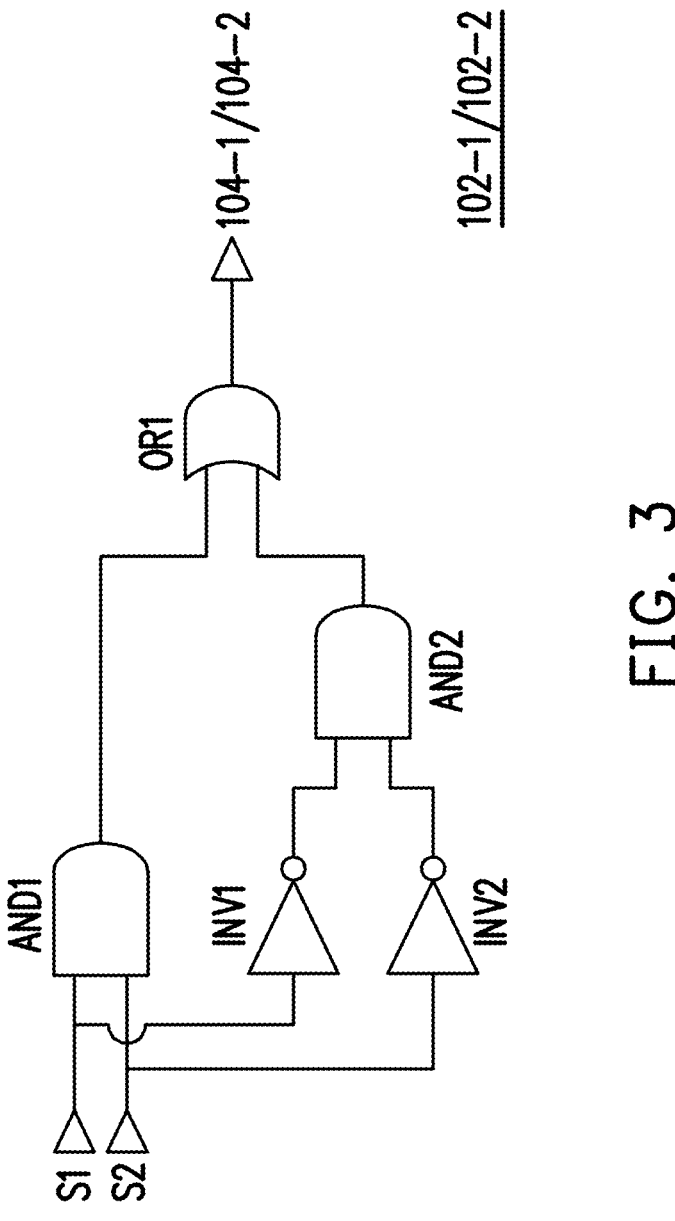
FIG. 3 is a schematic view of a control circuit according to an embodiment of the disclosure.

The control circuits 102-1 and 102-2 may control a turned-on state of the switching circuits 104-1 and 104-2. When one of the switching circuit 104-1 and the switching circuit 104-2 is turned on, the other one of the switching circuit 104-1 and the switching circuit 104-2 is turned off. An implementation of the control circuits 102-1 and 102-2 may be, for example, shown in FIG. 3, including AND gates AND1 and AND2, NOT gates INV1 and INV2, and an OR gate OR1. A first input end and a second input end of the AND gate AND1 receive a control signal S1 and a control signal S2 respectively. Input ends of the NOT gates INV1 and INV2 are respectively coupled to the first input end and the second input end of the AND gate AND1. Output ends of the NOT gates INV1 and INV2 are respectively coupled to the first input end and the second input end of the AND gate AND1. A first input end and a second input end of the OR gate OR1 are coupled to output ends of the AND gates AND1 and AND2 respectively. An output end of the OR gate OR1 is coupled to the control end of the switching circuit 104-1 or 104-2. That is, if the OR gate OR1 belongs to the control circuit 102-1, the output end of the OR gate OR1 is coupled to the control end of switching circuit 104-1, and if the OR gate OR1 belongs to the control circuit 102-2, the output end of the OR gate OR1 is coupled to the control end of the switching circuit 104-2.

In the control circuit 102-1, the control signal S1 is set to a low voltage level, and in the control circuit 102-2, the control signal S1 is set to a high voltage level. When the switching circuit 104-1 is turned on, and the switching circuit 104-2 is turned off, the switching circuit 104-1 may be turned on and the switching circuit 104-2 may be turned off by setting the control signal S2 in the control circuits 102-1 and 102-2 to the low voltage level, so that the internal voltage provided by the internal voltage output circuit 106-1 may be output from the output pad P1 through the switching circuit 104-1. When the switching circuit 104-1 is turned off, and the switching circuit 104-2 is turned on, the switching circuit 104-1 may be turned off and the switching circuit 104-2 may be turned on by setting the control signal S2 in the control circuits 102-1 and 102-2 to the high voltage level, so that the internal voltage provided by the internal voltage output circuit 106-2 may be output from the output pad P1 through the switching circuit 104-2 and the output pad P2.

In this way, the internal voltage provided by the internal voltage output circuit 106-1 of the master memory chip 101-1 and the internal voltage provided by the internal voltage output circuit 106-2 of the slave memory chip 101-2 may be output through the output pad P1 of the master memory chip 101-1, and the internal voltages of the stacked master memory chip 101-1 and slave memory chip 101-2 may be measured, thereby improving convenience of chip testing.

It is worth noting that in the above embodiment, one master memory chip and one slave memory chip are taken as an example. However, in other embodiments, the memory device 100 may include more slave memory chips and the master memory chip stacked on each other, and the output pads of the slave memory chips and the output pad of the master memory chip are coupled to each other. Similar to the above embodiment, when one of the switching circuits of the slave memory chips and the switching circuit of the master memory chip is turned on, the remaining switching circuits of the switching circuits of the slave memory chips and the switching circuit of the master memory chip are turned off. In this way, the internal voltage of each of the slave memory chips may also be output from the output pad of the master memory chip as in the above embodiment.

Figure 4:
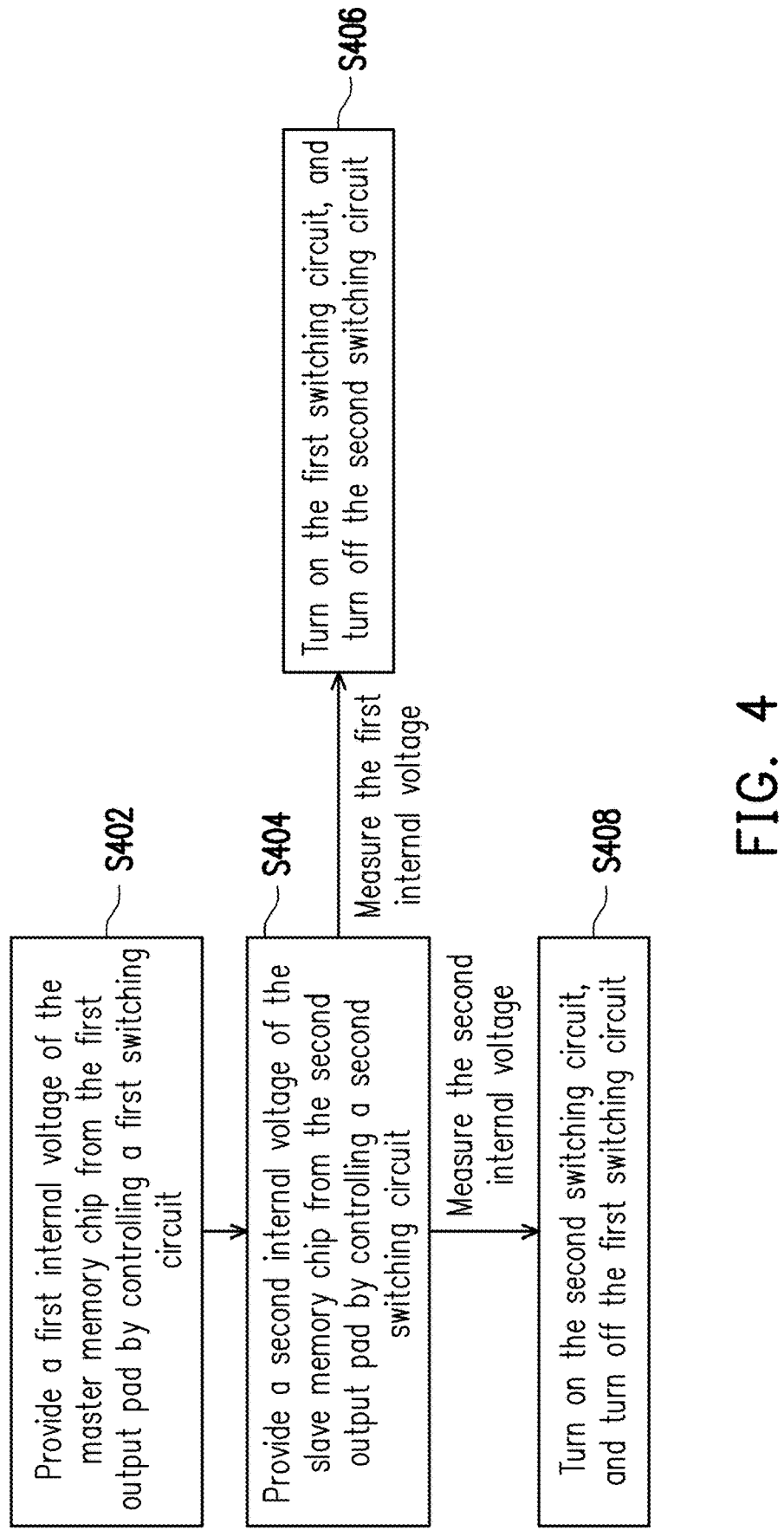
FIG. 4 is a flow chart of an internal voltage measuring method of a memory device according to an embodiment of the disclosure.

FIG. 4 is a flow chart of an internal voltage measuring method of a memory device according to an embodiment of the disclosure. The memory device includes a master memory chip and at least one slave memory chip. The master memory chip and the slave memory chip are stacked on each other. The master memory chip includes a first output pad, and each of the slave memory chips includes a second output pad. The first output pad is coupled to the second output pad, for example, the first output pad and the second output pad may be coupled to each other through a through silicon via. The internal voltage measuring method of the memory device may include at least the following steps. Providing a first internal voltage of the master memory chip from the first output pad by controlling a first switching circuit (step S402). Providing a second internal voltage of the slave memory chip from the second output pad by controlling a second switching circuit (step S404). When the first internal voltage is measured, the first switching circuit may be turned on, and the second switching circuit may be turned off (step S406), so as to output the first internal voltage on the first output pad. When the second internal voltage is measured, the second switching circuit may be turned on, and the first switching circuit may be turned off (step S408), so as to output the second internal voltage of the slave memory chip on the first output pad.

Based on the above, in the embodiments of the disclosure, the output pads of the master memory chip and the slave memory chip are coupled, and the turned-on state of the switching circuit coupled to the output pad and the internal voltage output end in the master memory chip and the slave memory chip is controlled. When one of the switching circuit of the master memory chip and the switching circuit of the slave memory chip is turned on, the other of the switching circuit of the master memory chip and the switching circuit of the slave memory chip is turned off, so as to output internal voltage of the master memory chip or the slave memory chip from the output pad of the master memory chip. In this way, the internal voltage of each of the stacked chips may be measured, improving the convenience of the chip testing.

What is claimed is:

1. A memory device, comprising:
   a master memory chip, comprising:
      a first control circuit;
      a first output pad; and
      a first switching circuit coupled between a first internal voltage output end of the master memory chip and the first output pad, wherein the first control circuit controls the first switching circuit, and the first internal voltage output end is configured to output a first internal voltage; and
   at least one slave memory chip, wherein the master memory chip and the slave memory chip are stacked on each other, and each of the slave memory chips comprises:

a second control circuit;
      a second output pad coupled to the first output pad; and
      a second switching circuit coupled between a second internal voltage output end of the slave memory chip and the second output pad, wherein the second internal voltage output end is configured to output a second internal voltage, the second control circuit controls the second switching circuit, and when one of the first switching circuit and the second switching circuit is turned on, the other of the first switching circuit and the second switching circuit is turned off.

2. The memory device according to claim 1, wherein the memory device comprises a plurality of slave memory chips, and when one of a plurality of second switching circuits of the slave memory chips and the first switching circuit of the master memory chip is turned on, the remaining switching circuits of the second switching circuits and the first switching circuit of the master memory chip are turned off.

3. The memory device according to claim 1, wherein the master memory chip further comprises a first internal voltage output circuit, the slave memory chip further comprises a second internal voltage output circuit, the first internal voltage output circuit is coupled to the first switching circuit and provides the first internal voltage, and the second internal voltage output circuit is coupled to the second switching circuit and provides the second internal voltage.

4. The memory device according to claim 3, wherein the first internal voltage output circuit and the second internal voltage output circuit respectively comprise:
   a plurality of selection transistors, wherein a turned-on state of each of the selection transistors is controlled by a corresponding selection signal; and
   an output transistor, wherein each of the selection transistors is coupled between a corresponding internal voltage and the output transistor, the output transistor is further coupled to the first internal voltage output end or the second internal voltage output end, and a turned-on state of the output transistor is controlled by an output control signal.

5. The memory device according to claim 1, wherein the slave memory chip outputs the second internal voltage through the first output pad.

6. The memory device according to claim 1, wherein the first output pad and the second output pad are coupled to each other through a through silicon via.

7. The memory device according to claim 1, wherein the first control circuit and the second control circuit respectively comprises:
   a first AND gate, wherein a first input end and a second input end thereof receive a first control signal and a second control signal respectively;
   a first NOT gate, wherein an input end thereof is coupled to the first input end of the first AND gate;
   a second NOT gate, wherein an input end thereof is coupled to the second input end of the first AND gate;
   a second AND gate, wherein a first input end and a second input end thereof are respectively coupled to output ends of the first NOT gate and the second NOT gate; and
   an OR gate, wherein a first input end and a second input end thereof are respectively coupled to the output ends of the first NOT gate and the second NOT gate, and an output end of the OR gate is coupled to the first switching circuit or the second switching circuit.

8. An internal voltage measuring method of a memory device, wherein the memory device comprises a master memory chip and at least one slave memory chip, the master memory chip comprises a first output pad, each of the slave memory chips comprises a second output pad, and the internal voltage measuring method of the memory device comprises:

providing a first internal voltage of the master memory chip from the first output pad by controlling a first switching circuit;

providing a second internal voltage of the slave memory chip from the second output pad by controlling a second switching circuit, wherein the master memory chip and the slave memory chip are stacked on each other and the first output pad is coupled to the second output pad;

when measuring the second internal voltage of the slave memory chip, turning off the first switching circuit and turning on the second switching circuit; and when measuring the first internal voltage of the master memory chip, turning off the second switching circuit and turning on the first switching circuit.

9. The internal voltage measuring method of the memory device according to claim 8, wherein the slave memory chip outputs the second internal voltage through the first output pad.

10. The internal voltage measuring method of the memory device according to claim 8, wherein the first output pad and the second output pad are coupled to each other through a through silicon via.

* * * * *